United States Patent
Kim et al.

(10) Patent No.: US 10,146,129 B2
(45) Date of Patent: *Dec. 4, 2018

(54) PHOTOSENSITIVE RESIN COMPOSITION, BLACK PIXEL DEFINING LAYER USING THE SAME AND DISPLAY DEVICE

(71) Applicant: SAMSUNG SDI CO., LTD., Yongin-si, Gyeonggi-do (KR)

(72) Inventors: Sang Soo Kim, Yongin-si (KR); Jinhee Kang, Yongin-si (KR); Heekyoung Kang, Yongin-si (KR); Chang-Hyun Kwon, Yongin-si (KR); Jiyun Kwon, Yongin-si (KR); ChanWoo Kim, Yongin-si (KR); Bumjin Lee, Yongin-si (KR); Junho Lee, Yongin-si (KR); Chungbeum Hong, Yongin-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/498,885

(22) Filed: Apr. 27, 2017

(65) Prior Publication Data

US 2018/0149974 A1    May 31, 2018

(30) Foreign Application Priority Data

Nov. 25, 2016 (KR) .................. 10-2016-0158551

(51) Int. Cl.
| | | |
|---|---|---|
| *G03F 7/037* | (2006.01) | |
| *G03F 7/004* | (2006.01) | |
| *G03F 7/038* | (2006.01) | |
| *G03F 7/039* | (2006.01) | |
| *G03F 7/031* | (2006.01) | |
| *H01L 27/32* | (2006.01) | |

(52) U.S. Cl.
CPC ............ *G03F 7/037* (2013.01); *G03F 7/0048* (2013.01); *G03F 7/031* (2013.01); *G03F 7/038* (2013.01); *G03F 7/039* (2013.01); *H01L 27/3246* (2013.01)

(58) Field of Classification Search
None
See application file for complete search history.

(56) References Cited

U.S. PATENT DOCUMENTS

| | | | | |
|---|---|---|---|---|
| 5,176,971 | A * | 1/1993 | Shimamura ....... | G02F 1/133516 430/13 |
| 9,557,446 | B2 * | 1/2017 | Kang ................ | G03F 7/0387 |
| 2009/0246392 | A1 * | 10/2009 | Miyamoto ............ | C08K 3/04 427/385.5 |
| 2010/0038606 | A1 * | 2/2010 | Inoue .................. | B82Y 30/00 252/586 |
| 2010/0069520 | A1 * | 3/2010 | Kim .................. | C08G 73/1007 522/36 |
| 2013/0137036 | A1 * | 5/2013 | Jeong ................ | H01L 23/293 430/283.1 |
| 2015/0125789 | A1 * | 5/2015 | Park .................. | G03F 7/038 430/18 |
| 2016/0377765 | A1 * | 12/2016 | Kang ................ | G03F 7/0387 430/286.1 |
| 2017/0235225 | A1 * | 8/2017 | Murata .............. | G03F 7/031 430/281.1 |
| 2018/0017866 | A1 * | 1/2018 | Kim .................. | G03F 7/0042 |
| 2018/0088465 | A1 * | 3/2018 | Kwon ................ | G03F 7/037 |

FOREIGN PATENT DOCUMENTS

| | | | | |
|---|---|---|---|---|
| JP | 2009-237150 | * | 10/2009 | ............ G03F 7/004 |
| JP | 2010-032940 | * | 2/2010 | ............ G03F 7/004 |
| JP | 2010-169944 | A | 8/2010 | |
| JP | 2010-196041 | A | 9/2010 | |
| JP | 4678142 | B2 | 2/2011 | |
| JP | 5444833 | B2 | 1/2014 | |
| JP | 5576181 | B2 | 7/2014 | |
| JP | 2015-127748 | * | 7/2015 | ............ G03F 7/004 |
| KR | 10-0740929 | B1 | 7/2007 | |
| KR | 10-2010-0006362 | A | 1/2010 | |
| KR | 10-1399281 | B1 | 5/2014 | |
| KR | 10-1472174 | B1 | 12/2014 | |
| KR | 10-1491269 | B1 | 2/2015 | |
| KR | 10-2015-0146434 | A | 12/2015 | |
| KR | 10-2016-0003113 | A | 1/2016 | |
| TW | 201614013 | A | 4/2016 | |
| WO | 2014/194631 | * | 12/2014 | ............ G03F 7/004 |

OTHER PUBLICATIONS

Search Report dated Sep. 21, 2017, of the corresponding Taiwanese Patent Application No. 106116020.

* cited by examiner

*Primary Examiner* — Martin J Angebranndt
(74) *Attorney, Agent, or Firm* — Lee & Morse, P.C.

(57) ABSTRACT

A photosensitive resin composition, a black pixel defining layer, and a display device, the composition including a binder resin; a black colorant; a photopolymerizable monomer; a photopolymerization initiator; and a solvent, wherein the solvent includes a first acetate solvent and a second acetate solvent and a boiling point difference between the first acetate solvent and the second acetate solvent is about 10° C. to about 60° C.

17 Claims, 2 Drawing Sheets

PHOTOSENSITIVE RESIN COMPOSITION, BLACK PIXEL DEFINING LAYER USING THE SAME AND DISPLAY DEVICE

CROSS-REFERENCE TO RELATED APPLICATION

Korean Patent Application No. 10-2016-0158551 filed in the Korean Intellectual Property Office on Nov. 25, 2016, and entitled: "Photosensitive Resin Composition Black Pixel Defining Layer Using the Same and Display Device," is incorporated by reference herein in its entirety.

BACKGROUND

1. Field

Embodiments relate to a photosensitive resin composition, a black pixel defining layer using the same, and a display device.

2. Description of the Related Art

A photosensitive resin composition may be used to manufacture a color filter, a liquid crystal display material, a display device such as an organic light emitting diode, a display device panel material, or the like. For example, a color filter for a color liquid crystal display or the like may use a photosensitive resin layer (such as a black pixel barrier rib layer) on a border between colored layers (red, green, blue, or the like) to enhance display contrast or chromophore effects. This photosensitive resin layer may be formed of a black photosensitive resin composition.

SUMMARY

Embodiments are directed to a photosensitive resin composition, a black pixel defining layer using the same, and a display device.

The embodiments may be realized by providing a photosensitive resin composition including a binder resin; a black colorant; a photopolymerizable monomer; a photopolymerization initiator; and a solvent, wherein the solvent includes a first acetate solvent and a second acetate solvent and a boiling point difference between the first acetate solvent and the second acetate solvent is about 10° C. to about 60° C.

The first acetate solvent and the second acetate solvent may be included in a weight ratio of about 2:8 to about 8:2.

The solvent may further include propylene glycol monomethylether, ethyl lactate, or gamma butyrolactone.

The propylene glycol monomethylether, ethyl lactate, or gamma butyrolactone may be included in an amount of about 5 parts by weight to about 10 parts by weight, based on 100 parts by weight of the solvent.

The binder resin may include a polyamic acid polymer, a polyamic acid ester polymer, a polyhydroxyamide polymer, a polyimide polymer, a polybenzoxazole polymer, or a copolymer thereof.

The binder resin may be a polyamic acid-polyimide copolymer.

The polyamic acid-polyimide copolymer may include a polyamic acid repeating unit and a polyimide repeating unit, and the polyamic acid repeating unit and the polyimide repeating unit may be included in a mole ratio of about 5:5 to about 9:1.

The polyamic acid-polyimide copolymer may have a weight average molecular weight of about 3,000 g/mol to about 20,000 g/mol.

The black colorant may include an organic black pigment.

The photopolymerizable monomer may include a compound including at least two functional groups represented by Chemical Formula 1:

[Chemical Formula 1]

wherein, in Chemical Formula 1, $R^1$ is a hydrogen atom or a substituted or unsubstituted C1 to C10 alkyl group, and $L^1$ is a single bond or a substituted or unsubstituted C1 to C10 alkylene group.

The compound including at least two functional groups represented by Chemical Formula 1 may be a compound represented by Chemical Formula 2 or Chemical Formula 3:

[Chemical Formula 2]

[Chemical Formula 3]

wherein, in Chemical Formula 2 and Chemical Formula 3, p, q, r, and s are each independently an integer of 1 to 10.

The photosensitive resin composition may include about 1 wt % to about 20 wt % of the binder resin; about 1 wt % to about 20 wt % of the black colorant; about 1 wt % to about 5 wt % of the photopolymerizable monomer; about 0.1 wt % to about 5 wt % of the photopolymerization initiator; and the solvent, all wt % being based on a total weight of the photosensitive resin composition.

The photosensitive resin composition may further include malonic acid, 3-amino-1,2-propanediol, a silane coupling agent, a leveling agent, a surfactant, a radical polymerization initiator, or a combination thereof.

The embodiments may be realized by providing a black pixel defining layer manufactured using the photosensitive resin composition according to an embodiment.

The embodiments may be realized by providing a display device including the black pixel defining layer according to an embodiment.

The display device may be an organic light emitting diode (OLED).

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when specific definition is not otherwise provided, "substituted" refers to replacement of at least one hydrogen atom by a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

As used herein, when specific definition is not otherwise provided, "hetero" refers to inclusion of at least one heteroatom of N, O, S, and P in chemical formulae.

As used herein, when specific definition is not otherwise provided, "(meth)acrylate" refers to both "acrylate" and "methacrylate", and "(meth)acrylic acid" refers to "acrylic acid" and "methacrylic acid".

As used herein, when a definition is not otherwise provided, the term "combination" refers to mixing or copolymerization. In addition, "copolymerization" refers to block copolymerization to random copolymerization, and "copolymer" refers to a block copolymer to a random copolymer.

As used herein, when specific definition is not otherwise provided, an unsaturated bond includes a bond between other atoms such as a carbonyl bond, or an azo bond as well as a multi-bond between carbon-carbon atoms.

In chemical Formulae of the present specification, unless a specific definition is otherwise provided, hydrogen is bonded at the position when a chemical bond is not drawn where supposed to be given.

As used herein, when specific definition is not otherwise provided, "*" indicates a point where the same or different atom or chemical formula is linked.

A photosensitive resin composition according to an embodiment may include, e.g., (A) a binder resin; (B) a black colorant; (C) a photopolymerizable monomer; (D) a photopolymerization initiator; and (E) a solvent. The solvent may include, e.g., a first acetate or acetate-based solvent and a second acetate or acetate-based solvent. In an implementation, a boiling point difference between the first acetate solvent and the second acetate solvent may be, e.g., about 10° C. to about 60° C.

Some photosensitive resin layer compositions may be used as a barrier rib material in a display process of manufacturing a display device such as an organic light emitting diode and the like, wherein a large area glass is used, and thus may go through a process of slit coating, VCD, baking, and the like during coating of an organic layer. Such a process could cause three kinds of coating defects. First, a bubbly or bubble defect could be caused if the organic layer were to have high viscosity by volatilizing a solvent of the organic layer during the VCD process under a reduced pressure. Second, a pin stain could be caused if the organic layer were to contact a pin supporting the glass during the VCD/baking processes. The pin stain may be caused by a temperature difference of the pin, and so the pin may be capped to prevent the pin stain, but when an inappropriate solvent is used, the pin stain may easily result. Third, a Mura may be easily caused on the large area glass during the VCD/baking processes.

The photosensitive resin composition according to an embodiment may compensate for all these three defects described above, e.g., by using two kinds of acetate solvents (the first and second acetate solvents) such that the first and second acetate solvents have a boiling point difference of about 10° C. to about 60° C.

Hereinafter, each component is specifically described.

(E) Solvent

The solvent may include an acetate solvent. The acetate solvent includes two different kinds of acetate solvents (e.g., the first acetate solvent and the second acetate solvent). In addition, a boiling point difference between the first acetate solvent and the second acetate solvent may be, e.g., about 10° C. to about 60° C. (For example about 15° C. to about 55° C.). When the two different kinds of acetate solvents have a boiling point difference within the range, a defect margin during a VCD process may be wide and processibility may be improved due to a high Mura and pin stain margin.

The acetate solvent may include, e.g., PGMEA (propylene glycol monomethyl ether acetate, BP 146° C.), 3-MBA (3-methoxybutanol acetate, BP 172° C.), DMPA (di(propylene glycol) methyl ether acetate, BP 200° C.), ethylene glycol monobutyl ether acetate (BP 192° C.)), n-BA (n-butyl acetate, BP 126° C.), BCA (butyl carbitol acetate, BP 247° C.), PGDA (propylene glycol diacetate, BP 191° C.), primary amyl acetate (BP 146° C.), isobutyl acetate (BP 118° C.), isopropyl acetate (BP 89° C.), n-propyl acetate (BP 102° C.), isoamyl acetate (BP 142° C.), 2-2(butoxyethoxy)ethyl acetate (BP 245° C.), 2-ethylhexyl acetate (BP 199° C.), 2-methoxyethyl acetate (BP 145° C.), 2-(2-ethoxyethoxy) ethyl acetate (BP 218° C.), or the like.

The first acetate solvent and the second acetate solvent may be included in a weight ratio of about 2:8 to about 8:2, e.g., about 6:1 to about 1:6. Maintaining the weight ratio of the first acetate solvent and the second acetate solvent within the above-described range may help ensure that a bubble defect during a VCD process is avoided.

In an implementation, the solvent may further include propylene glycol monomethylether, ethyl lactate or gamma butyrolactone in addition to the acetate solvent (the first acetate solvent and the second acetate solvent). For example, the propylene glycol monomethylether, ethyl lactate or gamma butyrolactone may be included in an amount of about 5 parts by weight to about 10 parts by weight, based on 100 parts by weight of the solvent. The propylene glycol monomethylether, ethyl lactate, or gamma butyrolactone may be used within the ranges along with the acetate solvent as a solvent to help further improve solubility of a post-described binder resin, black colorant, photopolymerizable monomer, and photopolymerization initiator and thus reduce a Mura and the like.

In an implementation, the solvent may be included in a balance amount, e.g., about 5 wt % to about 60 wt % or about 7 wt % to about 55 wt %, based on a total weight of the photosensitive resin composition. When the solvent is included within the range, the photosensitive resin composition may have an appropriate viscosity and thus processibility may be improved during a manufacture of a black pixel defining layer.

(A) Binder Resin

The binder resin in the photosensitive resin composition according to an embodiment may include at least one selected from a polyamic acid polymer, a polyamic acid ester polymer, a polyhydroxyamide polymer, a polyimide polymer, a polybenzoxazole polymer, and a copolymer thereof.

In an implementation, the binder resin may be a polyamic acid-polyimide copolymer, e.g., an alkali soluble polyamic acid-polyimide copolymer.

The binder resin included in a photosensitive resin composition according to an embodiment may simultaneously have a polyimide unit (soluble in an organic solvent) and a polyamic acid unit (having a polyimide precursor structure) and thus may provide a black pixel defining layer having high heat resistance.

The black pixel defining layer having excellent heat resistance and pattern-forming capability may be realized by copolymerizing polyimide, a main structure of a polymer in order to help prevent excessive dissolution characteristics of polyamic acid, that is a polyimide precursor in an alkali aqueous solution and control solubility and thus obtaining appropriate solubility between an exposed region and a non-exposed region during a pattern formation.

For example, the polyamic acid-polyimide copolymer may include a polyamic acid repeating unit and a polyimide repeating unit. In an implementation, the polyamic acid repeating unit and the polyimide repeating unit may be included in a mole ratio of about 5:5 to about 9:1, e.g., about 5:5 to about 8:2, about 5:5 to about 7:3, or about 5:5 to about 6:4. When the polyamic acid repeating unit and the polyimide repeating unit are included in a mole ratio within the ranges, a step of about 1 μm may be easily realized, and a copolymerization resin having excellent cross-linking characteristics may be obtained. For example, maintaining the mole ratio of the polyimide repeating unit and the polyamic acid repeating unit in the copolymerization resin as described above may help prevent deterioration in developability of the composition.

For example, as for the copolymer, a mole ratio of the polyimide unit already having an imidization structure in a solution state may be adjusted to easily control solubility of a photosensitive resin itself in an alkali aqueous solution. In this way, the photosensitive resin may have appropriate solubility in the alkali aqueous solution by controlling a copolymerization ratio between an alkali-soluble imide structure and a polyamic acid structure of a polyimide precursor, and excellent heat resistance may be obtained by forming a fine pattern by introducing a cross-linking functional group at the terminal end (and/or a chain) of a copolymerization resin to cross-link an exposed region when light in a UV region is radiated by a light source and developing a non-exposed region and then, thermally curing the pattern at a high temperature of greater than or equal to about 250° C.

In an implementation, the polyamic acid-polyimide copolymer may have a weight average molecular weight of about 3,000 g/mol to about 20,000 g/mol, e.g., about 5,000 g/mol to about 20,000 g/mol or about 6,000 g/mol to about 10,000 g/mol. When the copolymer has a weight average molecular weight within the ranges, excellent pattern-forming capability may be obtained, and a thin film may having excellent mechanical thermal characteristics may be provided.

The copolymer may have an unsaturated double bond at at least one terminal end, e.g., at both terminal ends of the copolymerization resin. In an implementation, the unsaturated double bond may be present in the middle of a chain of the copolymerization resin in addition to the terminal ends of the copolymer. The unsaturated double bond at the terminal end (and/or in the middle of a chain) may work as a cross-linking functional group and thus may help improve cross-linking characteristics of the copolymer. For example,

In Chemical Formula 4 to Chemical Formula 7, $R^2$ to $R^6$ may each independently be or include, e.g., a hydrogen atom or a substituted or unsubstituted C1 to C10 alkyl group, and $L^2$ to $L^6$ may each independently be or include, e.g., a single bond or a substituted or unsubstituted C1 to C10 alkylene group.

For example, the copolymer may be represented by Chemical Formula 8.

[Chemical Formula 8]

a photosensitive resin composition having excellent contrast may be realized by introducing a monomer cross-linked by the photopolymerization initiator at the terminal end of a main structure (and/or in the middle of a chain) in order to apply cross-linking characteristics through exposure of the copolymer itself, wherein the monomer cross-linked by the photopolymerization initiator may be represented by one selected from Chemical Formula 4 to Chemical Formula 7.

In an implementation, the unsaturated double bond may be, e.g., derived from a compound selected from Chemical Formula 4 to Chemical Formula 7.

[Chemical Formula 4]

[Chemical Formula 5]

[Chemical Formula 6]

[Chemical Formula 7]

In Chemical Formula 8, $X^1$ and $X^2$ may each independently be or include, e.g., a substituted or unsubstituted tetravalent alicyclic organic group or a substituted or unsubstituted tetravalent aromatic organic group,

$L^7$ and $L^8$ may each independently be or include, e.g., a single bond, a substituted or unsubstituted C1 to C10 alkylene group, a substituted or unsubstituted C3 to C10 cycloalkylene group or a substituted or unsubstituted C6 to C20 arylene group, $R^7$ may be or may include, e.g., a substituted or unsubstituted acryl group, a substituted or unsubstituted methacryl group or a substituted or unsubstituted norbornene group, and m and n may each independently be an integer of 1 to 100,000.

For example, the tetravalent aromatic organic group may be represented by Chemical Formula 9.

[Chemical Formula 9]

The C6 to C20 arylene group may include a linking group represented by Chemical Formula 10.

[Chemical Formula 10]

In Chemical Formula 10, $L^9$ may be or may include, e.g., a substituted or unsubstituted C1 to C8 alkylene group.

In an implementation, the binder resin may be included in an amount of about 1 wt % to about 20 wt %, e.g., about 1 wt % to about 15 wt %, based on the total weight of the photosensitive resin composition. When the binder resin is included within the range, sensitivity, developability, resolution, and linearity of a pattern may be improved.

(B) Black Colorant

The black colorant may include, e.g., a pigment, a dye, or a combination thereof, which has high transmittance in ultraviolet (UV) and infrared regions and simultaneously, light-blocking properties in a visible ray region.

For example, the black colorant may have a maximum transmittance in a wavelength region of about 350 nm to about 400 nm/transmittance of greater than or equal to about 30 at a wavelength of about 550 nm.

When the black colorant having a maximum transmittance in tin a visible ray region the wavelength region of about 350 nm to about 400 nm/transmittance of greater than or equal to about 30 at the wavelength of about 550 nm is used to prepare a photosensitive resin composition, excellent heat resistance may be obtained by increasing photocurability in a UV region as well as light-blocking properties through a light source in a visible ray region, and in addition, a desired step may be realized by easily performing an exposure process through an easy alignment due to high transmittance in the ultraviolet (UV) region. The 550 nm is a wavelength for measuring optical density, and the 350 nm to 400 nm is a wavelength region where a photopolymerization initiator most efficiently causes a photoinitiation reaction, the higher the maximum transmittance in the wavelength region where the photopolymerization initiator most efficiently causes the photoinitiation reaction is relative to transmittance at the wavelength for measuring optical density, and the more an effect of improving light-blocking in the visible ray region and heat resistance through the light source in the UV region is obtained, and particularly, when the maximum transmittance in the wavelength region where the photopolymerization initiator most efficiently causes the photoinitiation reaction is 30 times larger than the transmittance at the wavelength for measuring optical density, the heat resistance may be much increased, and simultaneously, a step of about 1 μm may be realized by easily performing an exposure process due to high transmittance in an infrared ray wavelength region.

For example, the black colorant may be a mixture of an organic pigment and an inorganic pigment.

For example, the organic pigment may include a red pigment, a blue pigment, and a violet pigment.

If an inorganic pigment such as aniline black, perylene black, titanium black, carbon black, or the like were to be used alone as a black colorant, excellent light-blocking properties may be realized, but a process margin may not be maximized since development may be performed after only surface curing without internal curing.

In an implementation, the red pigment may include, e.g., C.I. red pigment 179, C.I. red pigment 254, C.I. red pigment 255, C.I. red pigment 264, C.I. red pigment 270, C.I. red pigment 272, C.I. red pigment 177, C.I. red pigment 89, or the like, or a mixture of two or more thereof.

In an implementation, the blue pigment may include, e.g., C.I. blue pigment 15:6, C.I. blue pigment 15:0, C.I. blue pigment 15:1, C.I. blue pigment 15:2, C.I. blue pigment 15:3, C.I. blue pigment 15:4, C.I. blue pigment 15:5, C.I blue pigment 15:6, C.I. blue pigment 16, or the like, or a mixture of two or more thereof.

In an implementation, the violet pigment may include, e.g., C.I. violet pigment 29 in a color index, dioxazine violet, first violet B, methyl violet lake, indanethrene brilliant violet, or the like, or a mixture of two or more thereof.

A mixture of the red pigment, the blue pigment, and the violet pigment may include 200 parts by weight to 400 parts by weight of the red pigment and 200 parts by weight to 400 parts by weight of the blue pigment based on 100 parts by weight of the violet pigment.

The organic pigment and the inorganic pigment may be mixed in a weight ratio of about 15:1 to about 25:1, e.g., about 20:1 to about 25:1. When the organic and inorganic pigments are mixed in a weight ratio within the range, the black colorant (a mixture of organic and inorganic pigments) may have about 30 times higher transmittance in a wavelength region of about 350 nm to about 400 nm than at a wavelength of 550 nm.

When the organic pigment and the inorganic pigment are used as the black colorant, a dispersing agent may be used therewith to disperse the pigment. For example, the pigment may be pretreated with the dispersing agent on the surface or added therewith to prepare the composition.

The dispersing agent may be a non-ionic dispersing agent, an anionic dispersing agent, a cationic dispersing agent, and the like. Examples of the dispersing agent may include polyalkylene glycol and esters thereof, polyoxyalkylene, a polyhydric alcohol ester alkylene oxide addition product, an alcohol alkylene oxide addition product, a sulfonate ester, a sulfonate salt, a carboxylate ester, a carboxylate salt, alkyl amide alkylene oxide addition product, alkyl amine, and the like, and these may be used alone or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001 made by BYK Co., Ltd.; EFKA-47, EFKA-47EA, EFKA-48, EFKA-49, EFKA-100, EFKA-400, EFKA-450 made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; or PB711, PB821, and the like made by Ajinomoto Inc.

The dispersing agent may be included in an amount of about 0.1 wt % to about 15 wt %, based on the total weight of the photosensitive resin composition. When the dispersing agent is included within the range, the composition has excellent stability, developability, and pattern-forming capability due to improved dispersion properties during manufacture of a black pixel defining layer.

In an implementation, the pigment may be pre-treated using a water-soluble inorganic salt and a wetting agent. When the pigment is pre-treated, an average particle diameter of the pigment may become finer.

The pre-treatment may be performed by kneading the pigment with a water-soluble inorganic salt and a wetting agent and then, filtering and washing the knead pigment.

The kneading may be performed at a temperature of about 40° C. to about 100° C., and the filtering and washing may be performed by filtering the pigment after washing away an inorganic salt with water and the like.

Examples of the water-soluble inorganic salt may include sodium chloride, potassium chloride, and the like. The wetting agent may make the pigment to be uniformly mixed with the water-soluble inorganic salt uniformly and be pulverized. Examples of the wetting agent may include alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used alone or as a mixture of two or more.

In an implementation, the pigment (after the kneading) may have an average particle diameter of about 5 nm to about 200 nm, e.g., about 5 nm to about 150 nm. When the pigment has an average particle diameter within the range, stability of pigment dispersion liquid may be improved and pixel resolution may not be deteriorated.

For example, the pigment may be used in a form of pigment dispersion liquid including the dispersing agent and a solvent which will be described later, and the pigment dispersion liquid may include a solid pigment, a dispersing agent, and a solvent. In an implementation, the solid pigment may be included in an amount of about 5 wt % to about 20 wt %, e.g., about 8 wt % to about 15 wt %, based on a total weight of the pigment dispersion liquid.

The black colorant may have higher maximum transmittance in a wavelength region of greater than or equal to about 800 nm than in a wavelength region of about 450 nm to about 700 nm. For example, the black colorant may have high transmittance about light in an infrared region and thus makes a patterning process efficient.

The black colorant may be included in a solid content of about 1 wt % to about 20 wt %, e.g., about 2 wt % to about 15 wt % based, on the total weight of the photosensitive resin composition. In an implementation, the black colorant may be included in an amount of about 40 wt % to about 60 wt % for a reference of the pigment dispersion liquid based on a total amount of the photosensitive resin composition. When the black colorant is included within the range, coloring effects and development performance may be improved.

(C) Photopolymerizable Monomer

The photopolymerizable monomer in the photosensitive resin composition according to an embodiment may be a single compound or a mixture of two or more different kinds of compounds.

When the photopolymerizable monomer is the mixture of two or more kinds of compounds, one of the two kinds of compounds may be a compound including at least two functional groups represented by Chemical Formula 1.

[Chemical Formula 1]

In Chemical Formula 1, $R^1$ may be or may include, e.g., a hydrogen atom or a substituted or unsubstituted C1 to C10 alkyl group, and

$L^1$ may be or may include, e.g., a single bond or a substituted or unsubstituted C1 to C10 alkylene group.

For example, the compound including at least two functional groups represented by Chemical Formula 1 may include 2 to 6 functional groups represented by Chemical Formula 1. In this case, during exposure of a pattern forming process, sufficient polymerization occurs and a pattern having improved heat resistance, light resistance, and chemical resistance may be formed.

In an implementation, the compound including at least two functional groups represented by Chemical Formula 1 may be a compound represented by Chemical Formula 2 or Chemical Formula 3.

[Chemical Formula 2]

[Chemical Formula 3]

In Chemical Formula 2 and Chemical Formula 3, p, q, r, and s may each independently be an integer of 1 to 10.

When the photopolymerizable monomer is a mixture of two or more kinds of compounds, the other compound of the two kinds of compounds may be a monofunctional or multi-functional ester compound of (meth)acrylic acid having at least one ethylenic unsaturated double bond.

The monofunctional or multi-functional ester compound of the (meth)acrylic acid having at least one ethylenic unsaturated double bond may include, e.g., ethylene glycol di(meth)acrylate, diethylene glycol di(meth)acrylate, triethylene glycol di(meth)acrylate, propylene glycol di(meth) acrylate, neopentylglycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritoltri(meth)acrylate, pentaerythritoltetra(meth) acrylate, pentaerythritol hexa(meth)acrylate, dipentaerythritol di(meth)acrylate, dipentaerythritoltri(meth)acrylate, dipentaerythritolpenta(meth)acrylate, dipentaerythritol hexa (meth)acrylate, bisphenol A epoxy(meth)acrylate, ethylene glycolmonomethylether (meth)acrylate, trimethylolpropanetri(meth)acrylate, tris(meth)acryloyloxyethyl phosphate, novolac epoxy (meth)acrylate, or a combination thereof.

Commercially available examples of the monofunctional or multi-functional ester compound of the (meth)acrylic acid having at least one ethylenic unsaturated double bond may be as follows. Examples of the mono-functional (meth) acrylic acid ester may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210", M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth)acrylic acid ester may include Aronix M-309®, M-400®, M-405®, M-450®, M-7100®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), and the like. The products may be used alone or as a mixture of two or more.

The photopolymerizable monomer may be treated with acid anhydride to help improve developability.

In an implementation, the photopolymerizable monomer may be included in an amount of about 1 wt % to about 5 wt %, e.g., about 1 wt % to about 3 wt %, based on the total weight of the photosensitive resin composition. When the photopolymerizable monomer is included within the ranges, the reactive unsaturated compound may be sufficiently cured during exposure in a pattern-forming process and may have excellent reliability and thus, may form a pattern having excellent heat resistance, light resistance, and chemical resistance and also, excellent resolution and close-contacting properties.

(D) Photopolymerization Initiator

The photosensitive resin composition according to an embodiment may include a photopolymerization initiator. The photopolymerization initiator may include, e.g., an acetophenone compound, a benzophenone compound, a thioxanthone compound, a benzoin compound, a triazine compound, an oxime compound, or the like.

Examples of the acetophenone compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone compound may include benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone compound may include thioxanthone, 2-chlorothioxanthone, 2-methylthioxanthone, isopropyl thioxanthone, 2,4-diethyl thioxanthone, 2,4-diisopropyl thioxanthone, and the like.

Examples of the benzoin compound may include benzoin, benzoin methyl ether, benzoin ethyl ether, benzoin isopropyl ether, benzoin isobutyl ether, benzyldimethylketal, and the like.

Examples of the triazine compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime compound may include an O-acyl oxime compound, 2-(O-benzoyloxime)-1-[4-(phenylthio) phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Examples of the O-acyl oxime compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, and 1-(4-phenylsulfanyl phenyl)-butan-1-oneoxime-O-acetate.

In an implementation, the photopolymerization initiator may further include, e.g., a carbazole compound, a diketone compound, a sulfonium borate compound, a diazo compound, an imidazole compound, a biimidazole compound, or the like, besides the compounds described above.

In an implementation, the photopolymerization initiator may be included in an amount of about 0.1 wt % to about 5 wt %, e.g., about 0.1 wt % to about 3 wt %, based on a total weight of the photosensitive resin composition. When the photopolymerization initiator is included within the range, the composition may be sufficiently photopolymerized when exposed to light during the pattern-forming process for preparing a black pixel defining layer, accomplishing excellent sensitivity and improving transmittance.

(F) Other Additives

In an implementation, the photosensitive resin composition may further include an additive, e.g., malonic acid, 3-amino-1,2-propanediol, a silane coupling agent, a leveling agent, a surfactant, a radical polymerization initiator, or a combination thereof.

The silane coupling agent may have a reactive substituent of a vinyl group, a carboxyl group, a methacryloxy group, an isocyanate group, an epoxy group, and the like, in order to improve close-contacting properties with a substrate.

Examples of the silane coupling agent may include trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane, epoxycyclohexyl)ethyltrimethoxysilane, and the like. These may be used alone or in a mixture of two or more.

The silane coupling agent may be included in an amount of about 0.01 parts by weight to about 10 parts by weight, based on 100 parts by weight of the photosensitive resin composition. When the silane coupling agent is included within the range, close-contacting properties, storage properties, and the like may be improved.

The photosensitive resin composition may further include a surfactant, e.g., a fluorine surfactant and/or a silicone surfactant in order to help improve coating properties and prevent a defect if desired.

Examples of the fluorine surfactant may include a commercial fluorine surfactant such as BM-1000®, and BM-1100® (BM Chemie Inc.); MEGAFACE F 142D®, F 172®, F 173®, F 183® and F 554® (Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-190®, SH-193®, SZ-6032®, and SF-8428®, or the like (Toray Silicone Co., Ltd.).

The silicone surfactant may include BYK-307, BYK-333, BYK-361N, BYK-051, BYK-052, BYK-053, BYK-067A, BYK-077, BYK-301, BYK-322, BYK-325, or the like, which are made by BYK Chem and commercially available.

The surfactant may be used in an amount of about 0.001 to about 5 parts by weight, based on 100 parts by weight of the photosensitive resin composition. When the surfactant is included within the range, excellent wetting on an IZO substrate or a glass substrate as well as coating uniformity may be secured, a stain may not be produced.

In an implementation, the photosensitive resin composition may include other additives such as an antioxidant, a stabilizer, or the like in a predetermined amount if the other additives do not adversely affect or deteriorate properties of the photosensitive resin composition.

The photosensitive resin composition according to an embodiment may be either positive or negative. In an implementation, the composition may be negative to completely remove residues in regions where a pattern is exposed after exposing and developing the composition having light-blocking properties.

Another embodiment provides a black pixel defining layer manufactured by exposure, development, and curing of the photosensitive resin composition.

A method of manufacturing the black pixel defining layer may be as follows.

(1) Coating and Film Formation

The photosensitive resin composition may be coated to have a desired thickness on a substrate such as a glass substrate or an ITO substrate which undergoes a predetermined pretreatment, using a spin or slit coating, a roll coating method, a screen-printing method, an applicator method, or the like, and may be heated at about 70° C. to about 110° C. for about 1 minute to 10 minutes to remove a solvent, forming a photosensitive resin layer.

(2) Exposure

The photosensitive resin layer may be patterned by disposing a mask and then, radiating an actinic ray of about 200 nm to about 500 nm. The radiation may be performed using a light source such as a mercury lamp with a low pressure, a high pressure, or an ultrahigh pressure, a metal halide lamp, an argon gas laser, and the like. In an implementation, an X-ray, an electron beam, or the like may be used.

The exposure process may use, e.g., a light dose of about 500 mJ/cm$^2$ or less (with a 365 nm sensor) when a high pressure mercury lamp is used. In an implementation, the light dose may vary depending on kinds of each component, its combination ratio, and a dry film thickness.

(3) Development

After the exposure process, an alkali aqueous solution may be used to develop the exposed film by dissolving and removing an unnecessary (e.g., unexposed) part except the exposed part, forming a pattern.

(4) Post-treatment

The developed image pattern may be post-heated in order to accomplish excellent quality in terms of heat resistance, photo resistance, close contacting properties, crack-resistance, chemical resistance, high strength, storage stability, and the like. For example, after development, heat-treatment may be performed under a nitrogen atmosphere in a convection oven of about 250° C. for about 1 hour.

Another embodiment provides a display device including the black pixel defining layer.

The display device may be an organic light emitting diode (OLED).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES (Synthesis of Binder Resin)

Synthesis Example 1

86.6 g of N-methyl-2-pyrrolidone (NMP) was put in a four-necked flask equipped with a stirrer, a thermostat, a nitrogen gas injector, and a condenser, while nitrogen was passed thereinto, 12.3 g of 4,4'-(hexafluoroisopropylidene) diphthalicanhydride (6-FDA) was added thereto and dissolved. When the solid was completely dissolved, 3.25 g of 3-aminophenyl sulfone (3-DAS) was added thereto, and the mixture was stirred at ambient temperature for 2 hours. Then, the temperature was increased up to 90° C., 5.6 g of pyridine, 2.05 g of acetic anhydride ($A_2CO$) were added thereto, and the obtained mixture was stirred for 3 hours. The temperature in the reactor was cooled down to ambient temperature, 1.6 g of 2-hydroethylmethacrylate (HEMA) was added thereto, and the obtained mixture was stirred for 6 hours. Subsequently, 3.25 g of 3-aminophenyl sulfone (3-DAS) was added thereto, and the obtained mixture was stirred for 6 hours to complete the reaction. The reaction mixture was added to water to produce a precipitate, the precipitate was filtered, sufficiently cleaned with water, and dried at 50° C. under a vacuum condition (−0.1 MPa) for greater than or equal to 24 hours to manufacture a polyamic acid-polyimide copolymer. The copolymer had a weight average molecular weight of 7,500 g/mol in terms of standard polystyrene in a GPC (Gel Permeation Chromatography) method, polydispersity of 1.75, and a glass transition temperature of 200° C. (A mole ratio of a polyimide unit:a polyamic acid unit=50:50)

(Preparation of Photosensitive Resin Composition)

Examples 1 to 17 and Comparative Examples 1 to 10

A photopolymerization initiator was dissolved in a solvent in each composition shown in Table 1, and the solution was stirred at ambient temperature for 2 hours. A binder resin and a photopolymerizable monomer were added thereto, and the mixture was stirred at ambient temperature for one hour. Subsequently, a fluorine surfactant (other additive) and a black colorant were added thereto, the mixture was stirred at ambient temperature for one hour, and the obtained entire solution was stirred for 2 hours. The solution was filtered three times to remove impurities to prepare photosensitive resin compositions.

(A) Binder Resin
Polyamic acid-polyimide copolymer of Synthesis Example 1

(B) Black Colorant
Organic black pigment dispersion liquid (CI-IM-126, SAKATA Corp.; organic black pigment solid content 15 wt %)

TABLE 1

(unit: g)

| | Binder resin | Black colorant | Photo-polymerizable monomer | | Photo-polymerization initiator | | Solvent | | | | Other additive |
|---|---|---|---|---|---|---|---|---|---|---|---|
| | | | C-1 | C-2 | D-1 | D-2 | | | | | |
| Ex. 1 | 4.5 | 44.0 | 1.0 | 1.0 | 0.4 | 0.4 | (E-1) 25.4 | (E-2) 23.4 | — | | 0.03 |
| Ex. 2 | 4.5 | 44.0 | 1.0 | 1.0 | 0.4 | 0.4 | (E-1) 7.0 | (E-2) 41.88 | — | | 0.03 |
| Ex. 3 | 4.5 | 44.0 | 1.0 | 1.0 | 0.4 | 0.4 | (E-1) 25.4 | (E-3) 23.4 | — | | 0.03 |
| Ex. 4 | 4.5 | 44.0 | 1.0 | 1.0 | 0.4 | 0.4 | (E-1) 7.0 | (E-3) 41.88 | — | | 0.03 |
| Ex. 5 | 4.5 | 44.0 | 1.0 | 1.0 | 0.4 | 0.4 | (E-1) 25.4 | (E-4) 23.4 | — | | 0.03 |
| Ex. 6 | 4.5 | 44.0 | 1.0 | 1.0 | 0.4 | 0.4 | (E-1) 7.0 | (E-4) 41.88 | — | | 0.03 |
| Ex. 7 | 4.5 | 44.0 | 1.0 | 1.0 | 0.4 | 0.4 | (E-1) 25.4 | (E-5) 23.4 | — | | 0.03 |
| Ex. 8 | 4.5 | 44.0 | 1.0 | 1.0 | 0.4 | 0.4 | (E-1) 7.0 | (E-5) 41.88 | — | | 0.03 |
| Ex. 9 | 4.5 | 44.0 | 1.0 | 1.0 | 0.4 | 0.4 | (E-1) 25.4 | (E-6) 23.4 | — | | 0.03 |
| Ex. 10 | 4.5 | 44.0 | 1.0 | 1.0 | 0.4 | 0.4 | (E-1) 7.0 | (E-6) 41.88 | — | | 0.03 |
| Ex. 11 | 4.5 | 44.0 | 1.0 | 1.0 | 0.4 | 0.4 | (E-7) 25.4 | (E-2) 23.4 | — | | 0.03 |
| Ex. 12 | 4.5 | 44.0 | 1.0 | 1.0 | 0.4 | 0.4 | (E-8) 25.4 | (E-2) 23.4 | — | | 0.03 |
| Ex. 13 | 4.5 | 44.0 | 1.0 | 1.0 | 0.4 | 0.4 | (E-9) 25.4 | (E-2) 23.4 | — | | 0.03 |
| Ex. 14 | 4.5 | 44.0 | 1.0 | 1.0 | 0.4 | 0.4 | (E-10) 25.4 | (E-2) 23.4 | — | | 0.03 |
| Ex. 15 | 4.5 | 44.0 | 1.0 | 1.0 | 0.4 | 0.4 | (E-1) 21.2 | (E-2) 23.4 | (E-11) 4.2 | | 0.03 |
| Ex. 16 | 4.5 | 44.0 | 1.0 | 1.0 | 0.4 | 0.4 | (E-1) 21.2 | (E-2) 23.4 | (E-12) 4.2 | | 0.03 |
| Ex. 17 | 4.5 | 44.0 | 1.0 | 1.0 | 0.4 | 0.4 | (E-1) 21.2 | (E-2) 23.4 | (E-13) 4.2 | | 0.03 |
| Comp. Ex. 1 | 4.5 | 44.0 | 1.0 | 1.0 | 0.4 | 0.4 | (E-11) 25.4 | (E-2) 23.4 | — | | 0.03 |
| Comp. Ex. 2 | 4.5 | 44.0 | 1.0 | 1.0 | 0.4 | 0.4 | (E-11) 25.4 | (E-17) 23.4 | — | | 0.03 |
| Comp. Ex. 3 | 4.5 | 44.0 | 1.0 | 1.0 | 0.4 | 0.4 | (E-1) 25.4 | (E-14) 23.4 | — | | 0.03 |
| Comp. Ex. 4 | 4.5 | 44.0 | 1.0 | 1.0 | 0.4 | 0.4 | (E-7) 7.0 | (E-14) 41.88 | — | | 0.03 |
| Comp. Ex. 5 | 4.5 | 44.0 | 1.0 | 1.0 | 0.4 | 0.4 | (E-1) 25.4 | (E-15) 23.4 | — | | 0.03 |
| Comp. Ex. 6 | 4.5 | 44.0 | 1.0 | 1.0 | 0.4 | 0.4 | (E-7) 7.0 | (E-15) 41.88 | — | | 0.03 |
| Comp. Ex. 7 | 4.5 | 44.0 | 1.0 | 1.0 | 0.4 | 0.4 | (E-1) 25.4 | (E-16) 23.4 | — | | 0.03 |
| Comp. Ex. 8 | 4.5 | 44.0 | 1.0 | 1.0 | 0.4 | 0.4 | (E-7) 7.0 | (E-16) 41.88 | — | | 0.03 |
| Comp. Ex. 9 | 4.5 | 44.0 | 1.0 | 1.0 | 0.4 | 0.4 | (E-1) 48.8 | — | — | | 0.03 |
| Comp. Ex. 10 | 4.5 | 44.0 | 1.0 | 1.0 | 0.4 | 0.4 | (E-1) 25.4 | (E-9) 23.4 | — | | 0.03 |

(C) Photopolymerizable Monomer
(C-1) Dipentaerythritolhexa(meth)acrylate (DPHA, Nippon Kayaku Co. Ltd.)
(C-2) Compound represented by Chemical Formula A (LTM II, BASF)

[Chemical Formula A]

(In Chemical Formula A, r and s are 2)
(D) Photopolymerization Initiator
(D-1) NCI-831 (ADEKA Corp.)
(D-2) IRG-819 (BASF)
(E) Solvent
(E-1) Propylene glycol monomethyl ether acetate (PG-MEA), BP 146° C. (Sigma-Aldrich Corporation)
(E-2) 3-methoxybutanol acetate (3-MBA), BP 172° C. (Sigma-Aldrich Corporation)
(E-3) Di(propylene glycol) methylether acetate (DMPA), BP 200° C. (Sigma-Aldrich Corporation)
(E-4) Ethylene glycol monobutylether acetate, BP 192° C. (Sigma-Aldrich Corporation)
(E-5) Propylene glycol diacetate, BP 191° C. (Sigma-Aldrich Corporation)
(E-6) 2-ethylhexyl acetate, BP 199° C. (Sigma-Aldrich Corporation)
(E-7) N-butyl acetate (n-BA), BP 126° C. (Sigma-Aldrich Corporation)
(E-8) Primary amyl acetate, BP 146° C. (Sigma-Aldrich Corporation)
(E-9) Isoamyl acetate, BP 142° C. (Sigma-Aldrich Corporation)
(E-10) 2-methoxyethyl acetate, BP 145° C. (Sigma-Aldrich Corporation)
(E-11) Propylene glycol monomethylether (Sigma-Aldrich Corporation)
(E-12) Ethyl lactate (Sigma-Aldrich Corporation)
(E-13) Gamma butyrolactone (Sigma-Aldrich Corporation)
(E-14) Butylcarbitol acetate (BCA), BP 247° C. (Sigma-Aldrich Corporation)
(E-15) 2-(2-butoxyethoxy)ethyl acetate, BP 245° C. (Sigma-Aldrich Corporation)
(E-16) 2-(2-ethoxyethoxy)ethyl acetate, BP 218° C. (Sigma-Aldrich Corporation)
(E-17) Ethylene glycol dimethyl ether (Sigma-Aldrich Corporation)

Evaluation 1: VCD Bubble Defect

Figure 1:
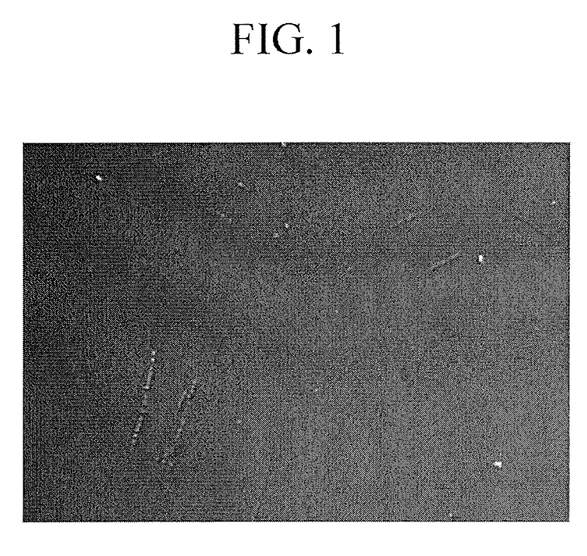
FIG. 1 illustrates an image showing a VCD defect evaluation of a specimen manufactured by using the photosensitive resin composition according to Example 1.
Figure 2:
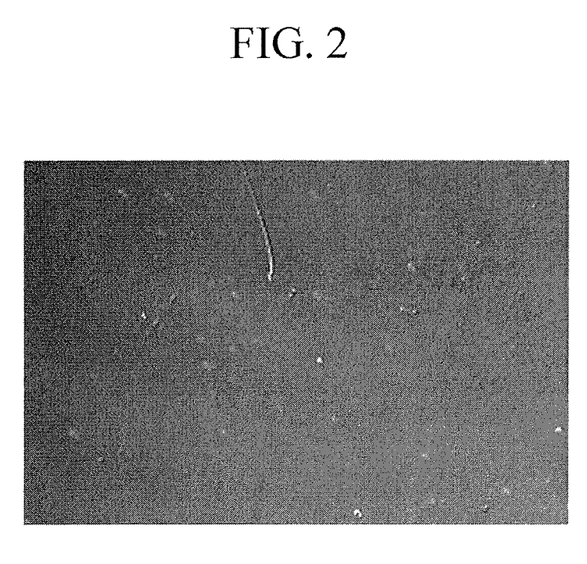
FIG. 2 illustrates an image showing a VCD defect evaluation of a specimen manufactured by using the photosensitive resin composition according to Comparative Example 1.

The photosensitive resin compositions according to Examples 1 to 17 and Comparative Examples 1 to 10 were respectively spin-coated on a 10 cm×10 cm ITO glass (a bare glass), pressed with a primary pressure (1 torr) by using VCD, and baked on a 100° C. hot plate for 1 minute. Subsequently, a bubble defect was examined in a polarized light mode under an enlargement of 50 times with an Olympus optical microscope, and the results are shown in Table 2 and FIGS. 1 and 2.

Figure 3:
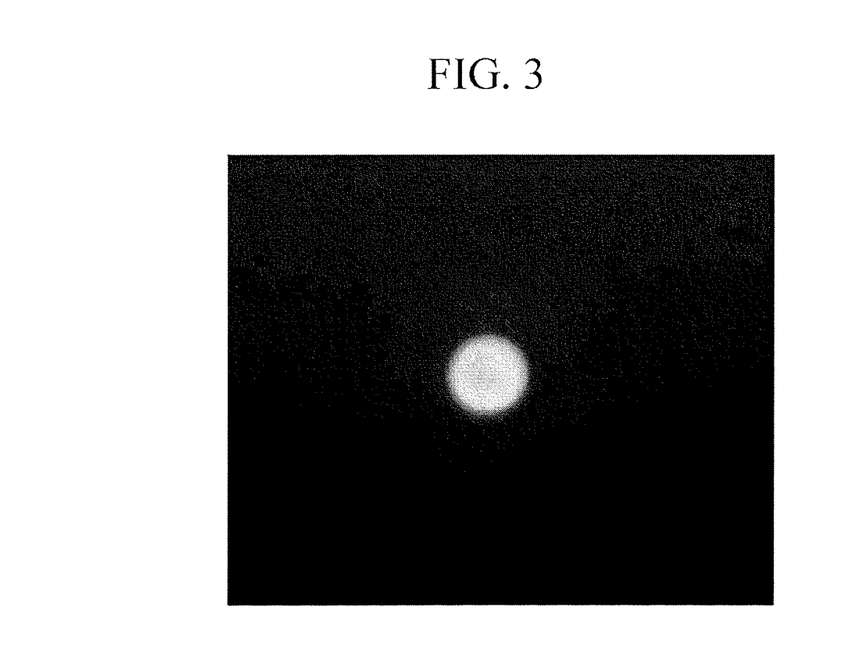
FIG. 3 illustrates an image showing a pin stain evaluation of the specimen manufactured by using the photosensitive resin composition according to Example 1.
Figure 4:
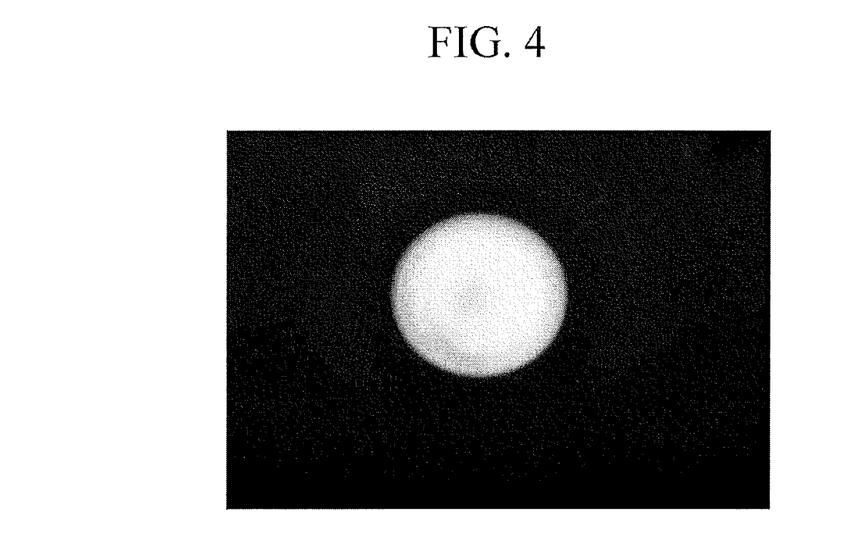
FIG. 4 illustrates an image showing a pin stain evaluation the specimen manufactured by using the photosensitive resin composition according to Comparative Example 1.

Evaluation Reference of VCD Bubble Defect
o: almost no bubble defect
Δ: some bubble defects
X: many bubble defects Evaluation 2: Evaluation of Pin Stain The photosensitive resin compositions according to Examples 1 to 17 and Comparative Examples 1 to 10 were respectively spin-coated on a 10 cm×10 cm ITO glass (a bare glass) and then, baked for one minute after putting a pin on a 100° C. hot plate in advance. Subsequently, a stain size of the pin was measured with an enlargement of 50 times in a polarized light mode by using an Olympus optical microscope, and the results are shown in Table 2 and FIGS. 3 and 4.

Evaluation Reference of Pin Stain
o: a small pin stain size
Δ: a medium pin stain size
X: a large pin stain size Evaluation 3: Mura Phenomenon The photosensitive resin compositions according to Examples 1 to 17 and Comparative Examples 1 to 10 were respectively spin-coated on a 10 cm×10 cm ITO glass (a bare glass) and then, baked for one minute after a pin was put on a 100° C. hot plate. Then, an Olympus optical microscope was used with an enlargement of 50 times in a polarized light mode to examine whether a Mura phenomenon occurred, and the results are shown in Table 2.

Evaluation Reference of Mura
o: no Mura phenomenon
Δ: some Mura phenomenon (a part of a specimen edge appears white)
X: plenty of Mura phenomena (most of a specimen edge appears white)

TABLE 2

|  | VCD bubble defect | Pin stain | Mura |
|---|---|---|---|
| Example 1 | o | o | o |
| Example 2 | o | o | o |
| Example 3 | o | o | o |
| Example 4 | o | o | o |
| Example 5 | o | o | o |
| Example 6 | o | o | o |
| Example 7 | o | o | o |
| Example 8 | o | o | o |
| Example 9 | o | o | o |
| Example 10 | o | o | o |
| Example 11 | o | o | o |
| Example 12 | o | o | o |
| Example 13 | o | o | o |
| Example 14 | o | o | o |
| Example 15 | o | o | o |
| Example 16 | o | o | o |
| Example 17 | o | o | o |
| Comparative Example 1 | X | o | o |
| Comparative Example 2 | X | X | o |
| Comparative Example 3 | o | Δ | Δ |
| Comparative Example 4 | o | Δ | Δ |
| Comparative Example 5 | o | Δ | Δ |
| Comparative Example 6 | o | Δ | Δ |
| Comparative Example 7 | o | Δ | Δ |
| Comparative Example 8 | o | Δ | Δ |
| Comparative Example 9 | Δ | Δ | Δ |
| Comparative Example 10 | o | Δ | Δ |

Referring to Table 2, the photosensitive resin composition according to an embodiment included two different kinds of acetate solvents (first and second acetate solvents) and exhibited improved VCD bubble defect margin and Mura and a pin stain margin by setting the first second acetate solvents to have a boiling point difference of 10° C. to 60° C.

By way of summation and review, the photosensitive resin layer (e.g., a pixel defining layer or the like) used as a material for a display device panel may have a small taper angle to help secure processibility and device reliability. In addition, a colorant such as a pigment, a dye, or the like (absorbing light in a visible ray region) may be used in order to help secure light-blocking properties.

The photosensitive resin composition may be coated on a large area glass through a process of slit-coating, VCD, baking, or the like. If an appropriate solvent were not used, a bubble defect or a pin stain could be generated in the VCD process under a reduced pressure. Accordingly, a photosensitive resin composition for a black pixel defining layer capable of addressing the above concerns has been considered.

The embodiments may provide a photosensitive resin composition capable of minimizing defects, pin stains, Muras, and the like in a VCD process.

The photosensitive resin composition according to an embodiment may have a large defect margin, a high Mura, and a high pin stain margin during the VCD process by using two different kinds of acetate solvents (the first and second acetate solvents) to have a boiling point difference in a range of about 10° C. to about 60° C. A binder resin, a black colorant, a photopolymerizable monomer, and a photopolymerization initiator consisting of the photosensitive resin composition according to an embodiment have high solubility in the two different kinds of acetate solvents (the first acetate solvent and the second acetate solvent).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photosensitive resin composition, comprising
   a binder resin, the binder resin including a polyamic acid-polyimide copolymer that includes a polyamic acid repeating unit and a polyimide repeating unit in a mole ratio of the polyamic acid repeating unit to the polyimide repeating unit of about 5:5 to about 9:1;
   a black colorant;
   a photopolymerizable monomer;
   a photopolymerization initiator; and
   a solvent,
   wherein:
   the solvent includes a first acetate solvent and a second acetate solvent,
   a boiling point difference between the first acetate solvent and the second acetate solvent is about 10° C. to about 60° C., and
   the polyamic acid-polyimide copolymer has a weight average molecular weight of about 3,000 g/mol to less than 20,000 g/mol.

2. The photosensitive resin composition as claimed in claim 1, wherein the first acetate solvent and the second acetate solvent are included in a weight ratio of about 2:8 to about 8:2.

3. The photosensitive resin composition as claimed in claim 1, wherein the solvent further includes propylene glycol monomethylether, ethyl lactate, or gamma butyrolactone.

4. The photosensitive resin composition as claimed in claim 3, wherein the propylene glycol monomethylether, ethyl lactate, or gamma butyrolactone is included in an amount of about 5 parts by weight to about 10 parts by weight, based on 100 parts by weight of the solvent.

5. The photosensitive resin composition as claimed in claim 1, wherein the binder resin further includes a polyamic acid ester polymer, a polyhydroxyamide polymer, a polybenzoxazole polymer, or a copolymer thereof.

6. The photosensitive resin composition as claimed in claim 1, wherein the black colorant includes an organic black pigment.

7. The photosensitive resin composition as claimed in claim 1, wherein the photopolymerizable monomer includes a compound including at least two functional groups represented by Chemical Formula 1:

[Chemical Formula 1]

wherein, in Chemical Formula 1,
$R^1$ is a hydrogen atom or a substituted or unsubstituted C1 to C10 alkyl group, and
$L^1$ is a single bond or a substituted or unsubstituted C1 to C10 alkylene group.

8. The photosensitive resin composition as claimed in claim 7, wherein the compound including at least two functional groups represented by Chemical Formula 1 is a compound represented by Chemical Formula 2 or Chemical Formula 3:

[Chemical Formula 2]

[Chemical Formula 3]

wherein, in Chemical Formula 2 and Chemical Formula 3, p, q, r, and s are each independently an integer of 1 to 10.

9. The photosensitive resin composition as claimed in claim 1, wherein the photosensitive resin composition includes:
about 1 wt % to about 20 wt % of the binder resin;
about 1 wt % to about 20 wt % of the black colorant;
about 1 wt % to about 5 wt % of the photopolymerizable monomer;
about 0.1 wt % to about 5 wt % of the photopolymerization initiator; and
the solvent, all wt % being based on a total weight of the photosensitive resin composition.

10. The photosensitive resin composition as claimed in claim 1, wherein the photosensitive resin composition further includes malonic acid, 3-amino-1,2-propanediol, a silane coupling agent, a leveling agent, a surfactant, a radical polymerization initiator, or a combination thereof.

11. A black pixel defining layer manufactured using the photosensitive resin composition as claimed in claim 1.

12. A display device including the black pixel defining layer as claimed in claim 11.

13. The display device as claimed in claim 12, wherein the display device is an organic light emitting diode (OLED).

14. The photosensitive resin composition as claimed in claim 1, wherein the mole ratio of the polyamic acid repeating unit to the polyimide repeating unit is 6:4 to 9:1.

15. The photosensitive resin composition as claimed in claim 1, wherein the mole ratio of the polyamic acid repeating unit to the polyimide repeating unit is greater than 6:4 to about 9:1.

16. The photosensitive resin composition as claimed in claim 1, wherein the polyamic acid-polyimide copolymer has a weight average molecular weight of about 3,000 g/mol to about 10,000 g/mol.

17. A photosensitive resin composition, comprising:
a binder resin, the binder resin including a polyamic acid-polyimide copolymer that has a weight average molecular weight of about 3,000 g/mol to less than 20,000 g/mol;
a black colorant;
a photopolymerizable monomer;
a photopolymerization initiator; and
a solvent,
wherein:
the solvent includes a first acetate solvent and a second acetate solvent, and
a boiling point difference between the first acetate solvent and the second acetate solvent is about 10° C. to about 60° C.

* * * * *